United States Patent
Choi et al.

(10) Patent No.: US 11,581,505 B2
(45) Date of Patent: Feb. 14, 2023

(54) WINDOW FOR DISPLAY DEVICE, METHOD FOR MANUFACTURING THE SAME, AND DISPLAY DEVICE INCLUDING THE SAME

(71) Applicant: Samsung Display Co., LTD., Yongin-si (KR)

(72) Inventors: Min-Hoon Choi, Seoul (KR);
Sanghoon Kim, Hwaseong-si (KR);
Seongjin Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 324 days.

(21) Appl. No.: 16/789,552

(22) Filed: Feb. 13, 2020

(65) Prior Publication Data
US 2020/0313114 A1 Oct. 1, 2020

(30) Foreign Application Priority Data
Apr. 1, 2019 (KR) ......................... 10-2019-0037751

(51) Int. Cl.
*H01L 51/52* (2006.01)

(52) U.S. Cl.
CPC .. *H01L 51/5237* (2013.01); *H01L 2251/5338* (2013.01)

(58) Field of Classification Search
CPC .................. H01L 51/5237; H01L 2251/5338
USPC ............................................................ 257/91
See application file for complete search history.

(56) References Cited

U.S. PATENT DOCUMENTS

| | | | |
|---|---|---|---|
| 2001/0007733 A1* | 7/2001 | Matsuyama | G02B 5/201 430/7 |
| 2017/0108960 A1* | 4/2017 | Lee | B32B 7/12 |
| 2017/0278900 A1* | 9/2017 | Yang | H01L 27/3272 |
| 2017/0324058 A1* | 11/2017 | Min | H04M 1/0266 |
| 2019/0051711 A1* | 2/2019 | Lee | H01L 27/323 |

FOREIGN PATENT DOCUMENTS

| | | |
|---|---|---|
| KR | 101185367 B1 | 9/2012 |
| KR | 1020150061357 A | 6/2015 |
| KR | 1020180053136 A | 5/2018 |
| KR | 101885109 B1 | 8/2018 |

\* cited by examiner

*Primary Examiner* — Xia L Cross
(74) *Attorney, Agent, or Firm* — Cantor Colburn LLP

(57) ABSTRACT

A display device includes a display panel from which light is transmitted; and a window through which the light from the display panel is transmitted to outside the display device. The window includes a transmission area through which the light is transmitted, a light shielding area which is adjacent to the transmission area and blocks the light, and a resin layer at which the window is attachable to the display panel, the resin layer defining a light shielding pattern which corresponds to the light shielding area and blocks the light.

16 Claims, 12 Drawing Sheets

WINDOW FOR DISPLAY DEVICE, METHOD FOR MANUFACTURING THE SAME, AND DISPLAY DEVICE INCLUDING THE SAME

This U.S. non-provisional patent application claims priority under 35 U.S.C. § 119 of Korean Patent Application No. 10-2019-0037751, filed on Apr. 1, 2019, the entire contents of which are hereby incorporated by reference.

BACKGROUND

(1) Field

The present disclosure herein relates to a display device, a window for a display device and a method for manufacturing the same. More particularly, the present disclosure relates to a display device having improved reliability, a window for a display device and a method for manufacturing the same.

(2) Description of the Related Art

A window which protects a display panel of a display device, is disposed on a front surface (e.g., a display screen) of the display panel. In particular, the window is adhered and fixed to an outer surface of the display panel so that a user may recognize an input of the user to the display device or an output of the display device, from outside the display device.

SUMMARY

The present disclosure provides a window for a display device capable of increasing reliability of a display device and a method for manufacturing the same. Particularly, the window reduces or effectively prevents a stepped portion from being generated due to a predetermined thickness of a light shielding pattern in the window at a bezel portion of the display device.

An embodiment of the invention provides a display device including: a display panel from which light is transmitted; and a window through which the light from the display panel is transmitted to outside the display device. The window includes a transmission area through which the light is transmitted, a light shielding area which is adjacent to the transmission area and blocks the light, and a resin layer at which the window is attachable to the display panel, the resin layer defining a light shielding pattern which corresponds to the light shielding area and blocks the light.

In an embodiment, the resin layer may further define a transmission pattern which is adjacent to the light shielding pattern and through which the light from the display panel is transmitted, and the transmission pattern may correspond to the transmission area and terminate at a boundary between the light shielding area and the transmission area.

In an embodiment, the transmission pattern may include a first polymer as a portion of a preliminary resin layer, and the light shielding pattern includes carbonized first polymer as a portion of the preliminary resin layer which is adjacent to the transmission pattern and carbonized.

In an embodiment, the transmission pattern may have a light transmittance of about 90% or more.

In an embodiment, the display device may further include: a first adhesive layer, a base substrate facing the resin layer with the first adhesive layer therebetween; and a second adhesive layer facing the first adhesive layer with the resin layer therebetween.

In an embodiment, each of the light shielding pattern and the transmission pattern may include a top surface and a bottom surface opposite to each other, the bottom surface being closer to the display panel than the top surface, and the top surface of the light shielding pattern and the top surface of the transmission pattern are coplanar with each other.

In an embodiment, the light shielding pattern may have a thickness equal to or less than a total thickness of the resin layer.

In an embodiment, the display panel may include: a display area at which an image is displayed, the display area corresponding to the transmission area of the window; and a non-display area adjacent to the display area, the non-display area corresponding to the light shielding area of the window.

In an embodiment, the window may include: a folding area at which the display device is bendable with respect to a folding axis; and a flat area which extends from the folding area in a direction away from the folding axis.

In an embodiment, the window may further include a glass substrate facing the display panel with the resin layer therebetween.

In an embodiment, the resin layer may have a thickness in a range from about 30 micrometers (μm) to about 200 μm.

In an embodiment, the resin layer may include at least one selected from polycarbonate ("PC"), polymethylmethacrylate ("PMMA"), polyimide ("PP"), polyethylene terephthalate ("PET"), tri-acetatecellulose ("TAC") and a combination thereof.

In an embodiment, the display device may further include a support layer between the resin layer and the display panel.

In an embodiment of the invention, a window for a display device includes: a base substrate including a transmission area through which light from a display panel is transmitted, and a light shielding area adjacent to the transmission area; and a resin layer between the base substrate and the display panel, the resin layer defining a light shielding pattern corresponding to the light shielding area of the base substrate.

In an embodiment, the resin layer may include a first polymer corresponding to the transmission area of the base substrate, and the light shielding pattern is defined by a carbonized portion of the first polymer corresponding to the light shielding area of the base substrate.

In an embodiment, the base substrate may include a glass substrate.

In an embodiment of the invention, a method for manufacturing a window for a display device includes: preparing a base substrate comprising: a transmission area through which light from a display panel is transmittable, and a light shielding area adjacent to the transmission area; and providing a resin layer of the window on the base substrate at the transmission area and the light shielding area thereof, and in which a light shielding pattern is defined corresponding to the light shielding area. The providing the resin layer includes applying light or heat corresponding to the light shielding area of the base substrate to define the light shielding pattern corresponding to the light shielding area.

In an embodiment, the applying the light or the heat may include a carbonization reaction corresponding to the light shielding area of the base substrate.

In an embodiment, the providing the resin layer may further include providing an adhesive layer between the resin layer in which the light shielding pattern is defined and the base substrate.

In an embodiment, the providing the resin layer may include: providing a carbonizable polymer on the base substrate at the transmission area and the light shielding area thereof, and applying the light or heat to a portion of the carbonizable polymer which corresponds to the light shielding area of the base substrate, to define the light shielding pattern within the resin layer of the window and corresponding to the light shielding area.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1A:
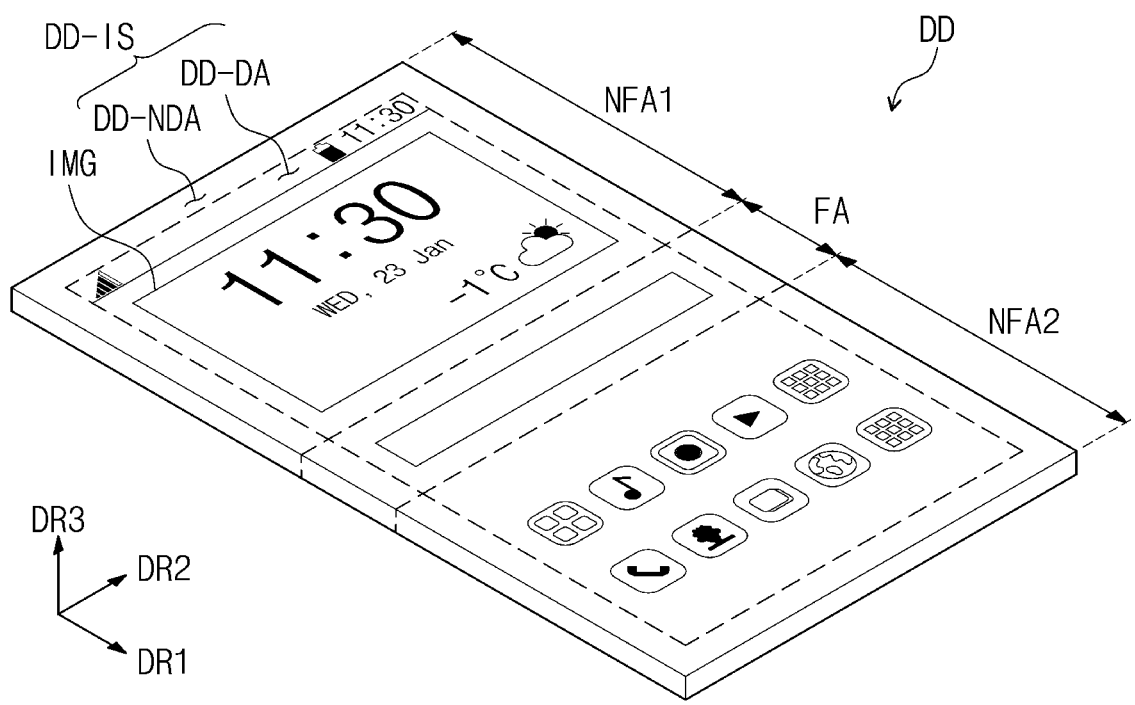
FIGS. 1A to 1C are perspective views illustrating an embodiment of a display device.

Hereinafter, embodiments of the present disclosure will be described below in more detail with reference to the accompanying drawings. Since the present disclosure may have diverse modified embodiments, specific embodiments are illustrated in the drawings and are described in the detailed description of this application. However, this does not limit the present disclosure within specific embodiments and it should be understood that the present disclosure covers all the modifications, equivalents, and replacements within the idea and technical scope of the invention.

Like reference numerals refer to like elements throughout. In the drawings, the dimensions and size of each structure are exaggerated, omitted, or schematically illustrated for convenience in description and clarity.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. The meaning of 'include' or 'comprise' specifies a property, a region, a fixed number, a step, a process, an element and/or a component but does not exclude other properties, regions, fixed numbers, steps, processes, elements and/or components.

In the specification, it will be understood that when a layer (or film), a region, or a plate is referred to as being related to another element such as being 'on' or 'under' another layer, region, or plate, it can be directly on or under the other layer, region, or plate, or intervening layers, regions, or plates may also be present. In contrast, when a layer (or film), a region, or a plate is referred to as being related to another element such as being 'directly on' or 'directly under' another layer, region, or plate, no intervening layers, regions, or plates are present therebetween. For example, the feature of "directly contact" may represent that an additional member such as an adhesive member is not present between two layers or two members.

Also, in this specification, a structure in which a layer, a film, a region, or a plate is disposed "on" another layer, film, region, or plate may include a structure in which the layer, film, region, or plate is disposed on a lower portion as well as an upper portion of another layer, film, region, or plate. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Typically, although a transparent synthetic resin is used for a window of a display device, the transparent synthetic resin has a limitation of discoloration or a low transmittance. Tempered glass has been developed, which has excellent transparency and excellent strength. Thus, the window including or made of a tempered glass material has been widely used in display devices.

Hereinafter, embodiments of a display device will be described with reference to the accompanying drawings.

Figure 1B:
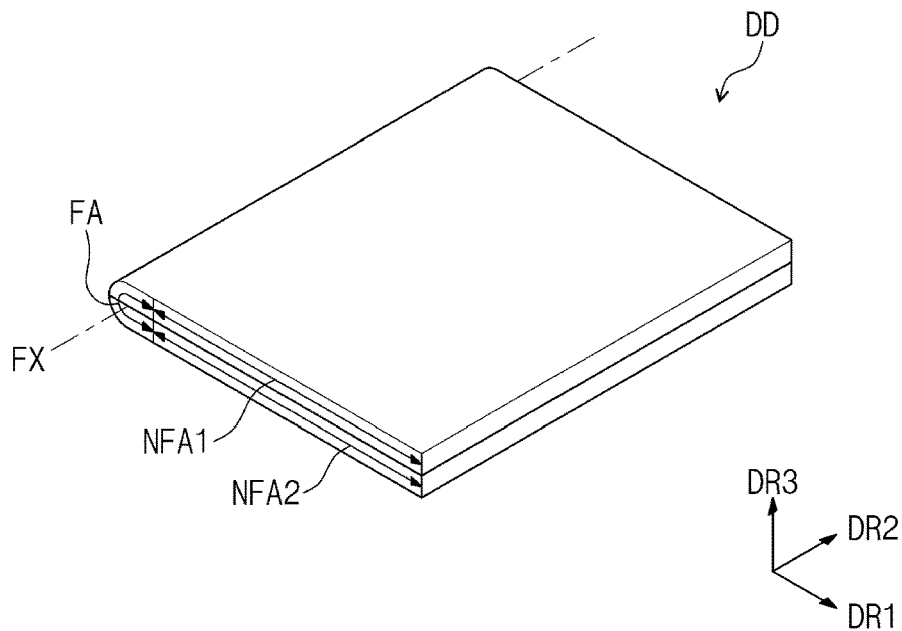
Figure 1C:
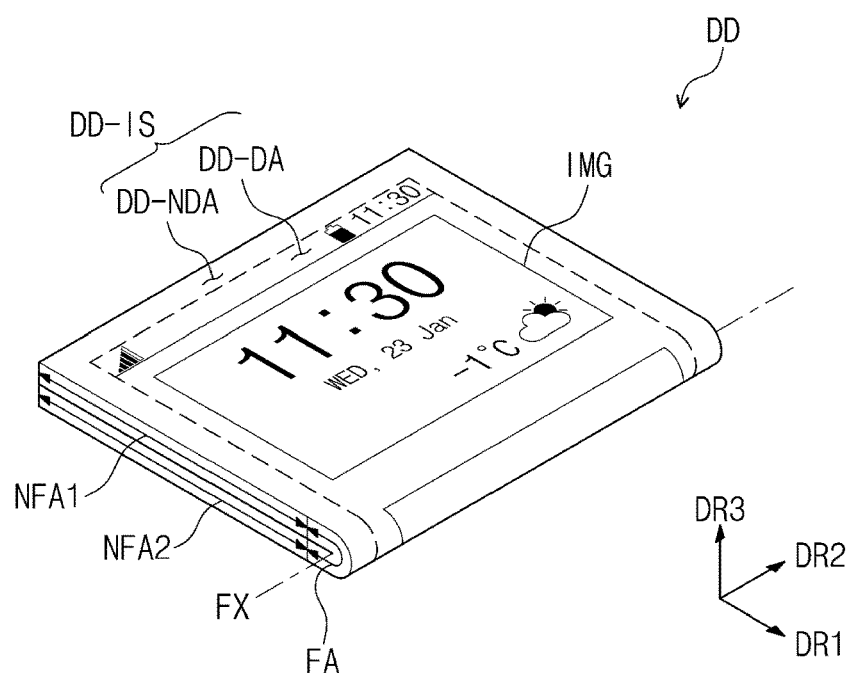

FIGS. 1A to 1C are perspective views illustrating an embodiment of a display device.

As illustrated in FIG. 1A, a display device DD may display an image IMG at a display surface DD-IS. The display surface DD-IS is disposed in a plane parallel to a plane defined by a first direction DR1 and a second direction DR2 which cross each other. A normal direction relative to the display surface DD-IS, e.g., a thickness direction of the display device DD, extends along a third direction DR3.

Hereinafter, a front surface (or top surface) and a rear surface (or bottom surface) of each of members or units of the display device DD are distinguished along the third direction DR3. However, the first to third directions DR1, DR2, and DR3 are intended to be illustrative in the embodiments. Hereinafter, first to third directions DR1, DR2, and DR3 may be directions indicated by the first to third direction DR1, DR2, and DR3 and designated by the same reference numerals, respectively.

As illustrated in FIG. 1A, the display surface DD-IS includes an image area DD-DA (e.g., display area DD-DA) at which the image IMG is displayed and a bezel area DD-NDA (e.g., non-display area DD-NDA) which is adjacent to the image area DD-DA. The bezel area DD-NDA is an area at which an image is not displayed. In FIG. 1A, icon images are illustrated as an example of the image IMG.

As illustrated in FIG. 1A, the image area DD-DA may have a rectangular shape defined at a central portion of the display surface DD-IS, to be spaced apart from an outer edge of the display device DD. The bezel area DD-NDA may be disposed extended along an outer edge of the display surface DD-IS to surround the image area DD-DA in a top plan view. However, the embodiment is not limited thereto. In an embodiment, for example, the image area DD-DA and the bezel area DD-NDA may have various planar shapes in the top plan view. A sum of the planar areas (e.g., a total planar area) of the image area DD-DA and the bezel area DD-NDA may define a total planar area of the display surface DD-IS.

As illustrated in FIGS. 1A to 1C, the display device DD may include a plurality of planar areas defined according to operations performed by the display device DD. The display device DD may include a first area NFA1, a second area NFA2, and a third area FA disposed between the first area NFA1 and the second area NFA2 along the first direction DR1. The display device DD and/or components thereof are foldable at third area FA relative to a folding axis FX lengthwise extended along the second direction DR2. The display device DD and/or components thereof which are bent at the third area FA about the folding axis FX provides a curvature.

Hereinafter, the first area NFA1, the second area NFA2, and the third area FA may be referred to as a first flat area NFA1, a second flat area NFA2, and a folding area FA. Each of the first flat area NFA1 and the second flat area NFA2 may maintain a flat state (e.g., disposed in a single plane) without having a curvature. Each of the first flat area NFA1 and the second flat area NFA2 may extend from the folding area FA in a direction away from the folding axis FX. A plurality of portions of the display surface DD-IS comprising the image area DD-DA and the bezel area DD-NDA may be disposed in each one of the first flat area NFA1, the second flat area NFA2 and the folding area FA.

As illustrated in FIG. 1B, the display device DD which is inner-folded disposes the display surface DD-IS at the first flat area NFA1 facing the display surface DD-IS at the second flat area NFA2. As illustrated in FIG. 1C, the display device DD which is outer-folded disposes the display surface DD-IS facing outside of the display device DD.

In an embodiment of the invention, the display device DD may include the folding area FA provided in plural (e.g., a plurality of folding areas FA) at which the display device DD and/or components thereof are foldable about a folding axis FX. In addition, the folding area FA may be defined in correspondence to directions and manners in which the display device DD is manipulated. In an embodiment, for example, the folding areas FA may be defined parallel to the first direction DR1 or defined in a diagonal direction which is inclined relative to the first direction DR1 and/or the second direction DR2, unlike FIGS. 1B and 1C. The folding area FA of the display device DD may have a planar area that is not fixed and may be variously determined according to a radius of curvature formed by the display device DD which is bent or folded.

In an embodiment of the invention, the display device DD may be foldable only between the configurations shown in FIGS. 1A and 1B (e.g., between being flat in FIG. 1A and inner-folded in FIG. 1B) or foldable only between the configurations shown in FIGS. 1A and 1C (e.g., between being flat in FIG. 1A and outer-folded in FIG. 1C). Also, although the foldable display device DD is exemplarily illustrated, the embodiment of the invention is not limited thereto. In an embodiment, for example, one or more embodiment of the invention may be applied to a display device DD which is rigid (e.g., only being flat like in FIG. 1A).

In this embodiment, the display device DD that is applicable to a mobile terminal is exemplarily illustrated. Although not shown, as electronic modules mounted on a main board, a camera module, and a power module are coupled with the display device DD in a housing (not shown), a mobile phone terminal may be provided including the display device DD. The housing may include a bracket. The housing may include various frames supporting the display device DD and/or a support including a hinge structure. The display device DD according to one or more embodiment of the invention may be used for relatively large-sized electronic devices such as televisions and display monitors as well as relatively small and medium-sized electronic devices such as tablet computers, navigation units for vehicles, game consoles, and smart watches.

FIG. 2A to 2D are cross-sectional views illustrating embodiment of a display device. FIGS. 2A to 2D illustrate a cross-section defined by the second direction DR2 and the third direction DR3. FIGS. 2A to 2D are simply illustrated for explaining a relationship between a functional panel and/or functional units of the display device DD.

The display device DD may include a protection unit, an input detection unit, an anti-reflection unit, and a window WP. A stacked structure including one or more of a display panel DP, the input detection unit, and the anti-reflection unit may be provided or formed through a continuous manufacturing process in which a previous layer forms a base and a subsequent layer is provided or formed on the base, or may be provided or formed by separately providing elements and subsequently coupling such elements to each other such as by using an adhesive member.

In FIGS. 2A to 2D, an optically clear adhesive member OCA is exemplarily illustrated as the adhesive member. Hereinafter, the adhesive member may include any of a number of adhesives such as a pressure-sensitive adhesive. In an embodiment of the invention, the protection unit, the anti-reflection unit, and the input detection unit may be variously replaced by a different component or omitted.

In FIGS. 2A to 2D, among the protection unit, the input detection unit and the anti-reflection unit, a component forming a stacked structure with another component through a continuous process is expressed by a "layer." Among the protection unit, the input detection unit and the anti-reflection unit, a component coupled with another component through the adhesive member to form a stacked structure is expressed by a "panel." Although the stacked structure related to the panel may include a base layer providing a base surface, e.g., a synthetic resin film, a composite material film or a glass substrate, the "layer" may not include the base layer. That is, the above-described units expressed as the "layer" is disposed on a base surface provided by another component or element. As used throughout this disclosure, unless otherwise specified, a feature "layer" may be used to represent the stacked structure of either the "layer" or the "panel" described above.

The protection unit, the input detection unit and the anti-reflection unit may together be referred to as a protection panel, an input detection panel, and an anti-reflection panel or a protection layer, an input detection layer, and an anti-reflection layer according to whether the base layer exists or not.

Figure 2A:
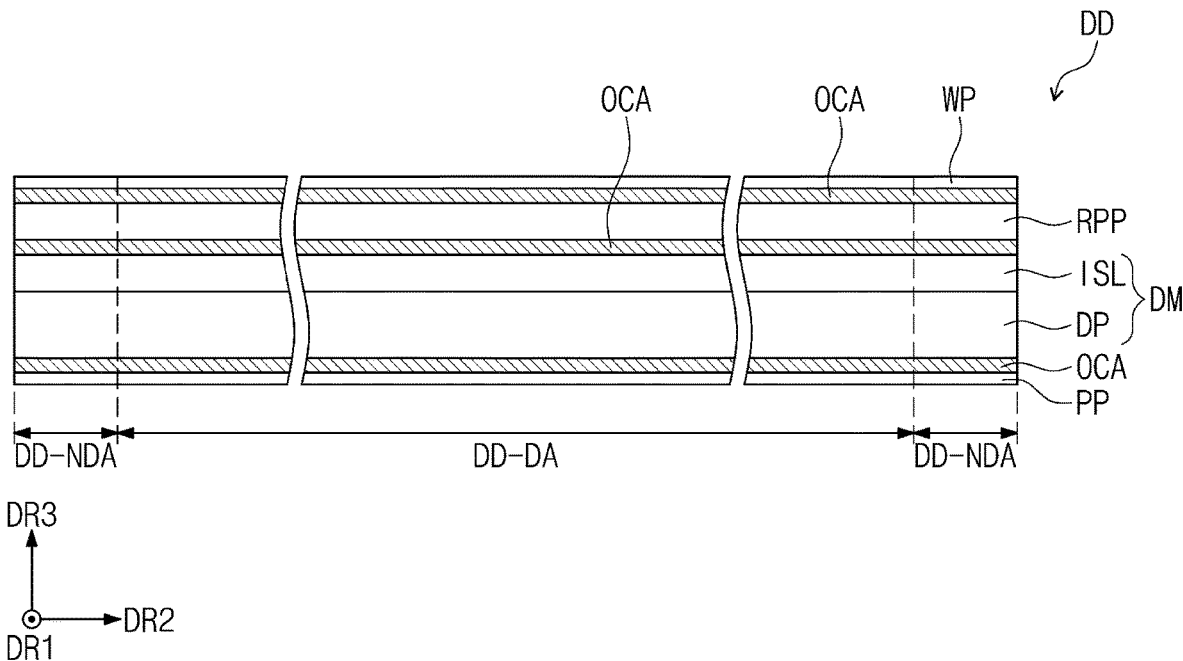
FIGS. 2A to 2D are cross-sectional views illustrating an embodiment of a display device.

As illustrated in FIG. 2A, the display device DD may include a protection panel PP, a display panel DP, an input detection layer ISL, an anti-reflection panel RPP, and a window WP. Each of the components of the display device DD may include a first flat area NFA1, a second flat area NFA2 and a folding area FA corresponding to those areas of the display device DD, without being limited thereto. In an embodiment, for example, the window WP may include a first flat area NFA1, a second flat area NFA2 and a folding area FA corresponding to those areas of the display device DD.

The input detection layer ISL is directly disposed on the display panel DP. In this specification, an expression of "B component is directly disposed on A component" represents that an additional element such as an adhesive layer or member is not disposed between A component and B component. The B component may be provided or formed on a base surface provided by the A component through a continuous process after the A component is provided or formed.

A display module DM may be defined by including the display panel DP and the input detection layer ISL directly disposed on the display panel DP. The optically clear adhesive member OCA may be disposed between the protection panel PP and the display module DM, between the display module DM and the anti-reflection panel RPP, and between the anti-reflection panel RPP and the window WP.

The display panel DP generates an image, and the input detection layer ISL acquires coordinate information of an external input from outside the display device DD (e.g., touch event). The display panel DP may include a pixel provided in plural (e.g., pixels) at which light is emitted, an image is generated and/or an image is displayed. The protection panel PP is disposed below the display module DM to protect the display module DM from an external impact. The display devices DD described below in FIGS. 2B to 2D also may further include the protection panel PP, and the protection panel PP may be replaced by a protection layer (e.g., provided or formed on a base surface provided by the display module DM through a continuous process after the display module DM is provided or formed).

The protection panel PP may include a synthetic resin film or a metal plate. The protection panel PP may have a multilayer structure including a plurality of synthetic resin films and/or a plurality of metal plates.

The display panel DP may be a light emitting display panel. The organic light emitting display panel may include a light emitting layer including an organic light emitting material. The quantum dot light emitting display panel may include a light emitting layer including a quantum dot and a quantum rod.

The anti-reflection panel RPP decreases a reflectance of external light that is incident from above the window WP (e.g., from outside the display device DD). The anti-reflection panel RPP may include a retarder and a polarizer. The retarder may be a film type or a liquid crystal coating type, and include a 212 retarder and/or a 214 retarder. The polarizer also may be a film type or a liquid crystal coating type. The film type may include a flexible synthetic resin film, and the liquid crystal coating type may include liquid crystals oriented in a predetermined orientation. Each of the retarder and the polarizer may further include a protection film.

The anti-reflection panel RPP may include color filters disposed on a base layer. The color filters have a predetermined arrangement. The arrangement of the color filters may be determined in consideration of colors emitted from pixels of the display panel DP. The anti-reflection panel RPP may further include a black matrix adjacent to the color filters.

The anti-reflection panel RPP may include a destructive interference structure disposed on the base layer. In an embodiment, for example, the destructive interference structure may include a first reflection layer and a second reflection layer, which are disposed in different layers from each other among layers provided on the base layer. First reflected light and second reflected light, which are reflected by the first reflection layer and the second reflection layer, respectively, may be destructively interfered, and thus a reflectance of external light may decrease.

Figure 2B:
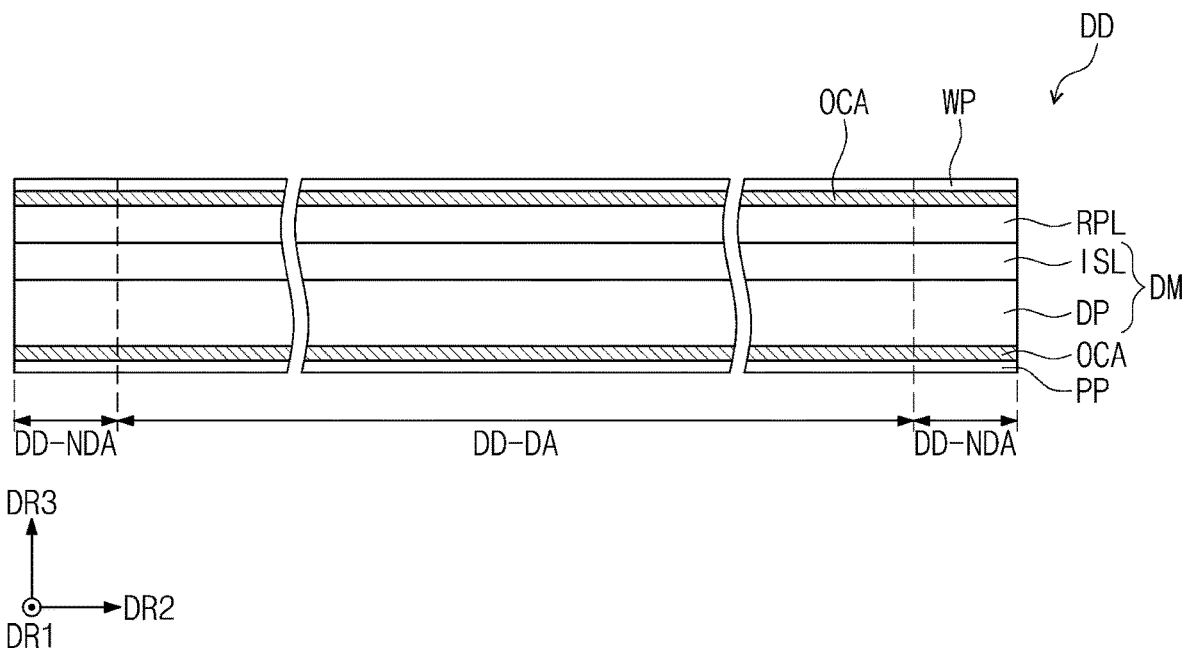

As illustrated in FIG. 2B, the anti-reflection panel RPP and the optically clear adhesive member OCA disposed between the display module DM and the anti-reflection panel RPP of FIG. 2A may be omitted, and an anti-reflection layer RPL may be disposed on an input detection layer ISL. The anti-reflection layer RPL and the input detection layer ISL may be changed in the stacked order thereof along a thickness direction of the stacked structure.

Figure 2C:
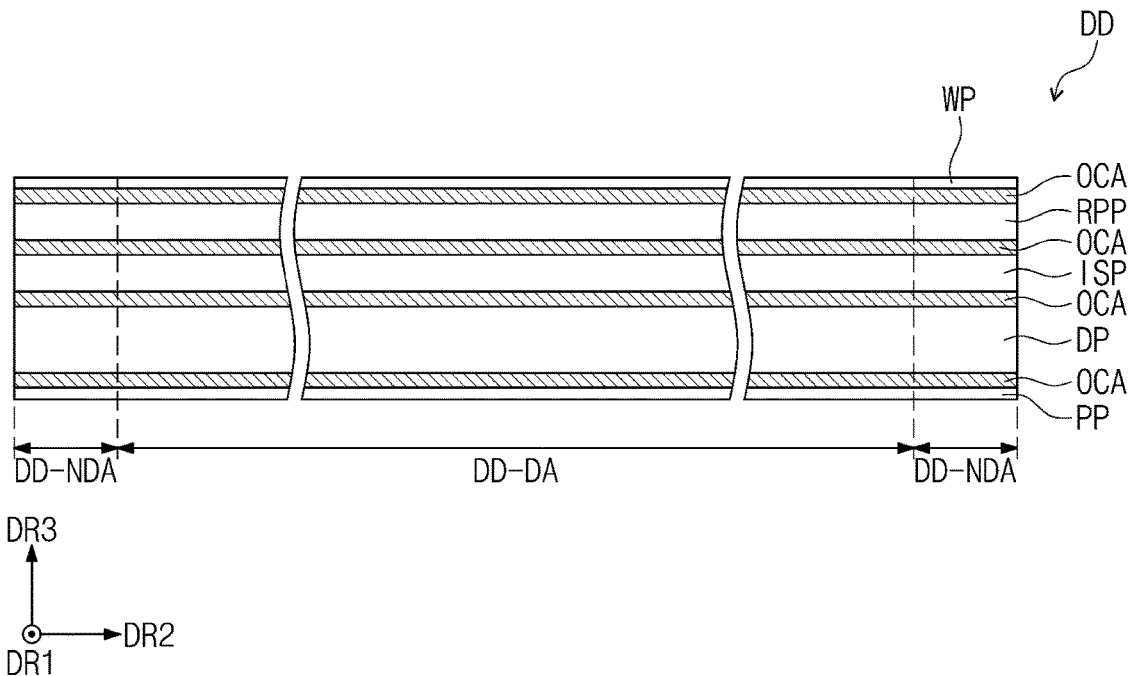

As illustrated in FIG. 2C, the display device DD may include a protection panel PP, a display panel DP, an input detection panel ISP, an anti-reflection panel RPP, and a window WP. An optically clear adhesive member OCA may be disposed between the protection panel PP and the display panel DP, between the display panel DP and the input detection panel ISP, between the input detection panel ISP and the anti-reflection panel RPP, and between the anti-reflection panel RPP and the window WP. The input detection panel ISP and the anti-reflection panel RPP may be changed in the stacked order thereof along a thickness direction of the stacked structure.

Figure 2D:
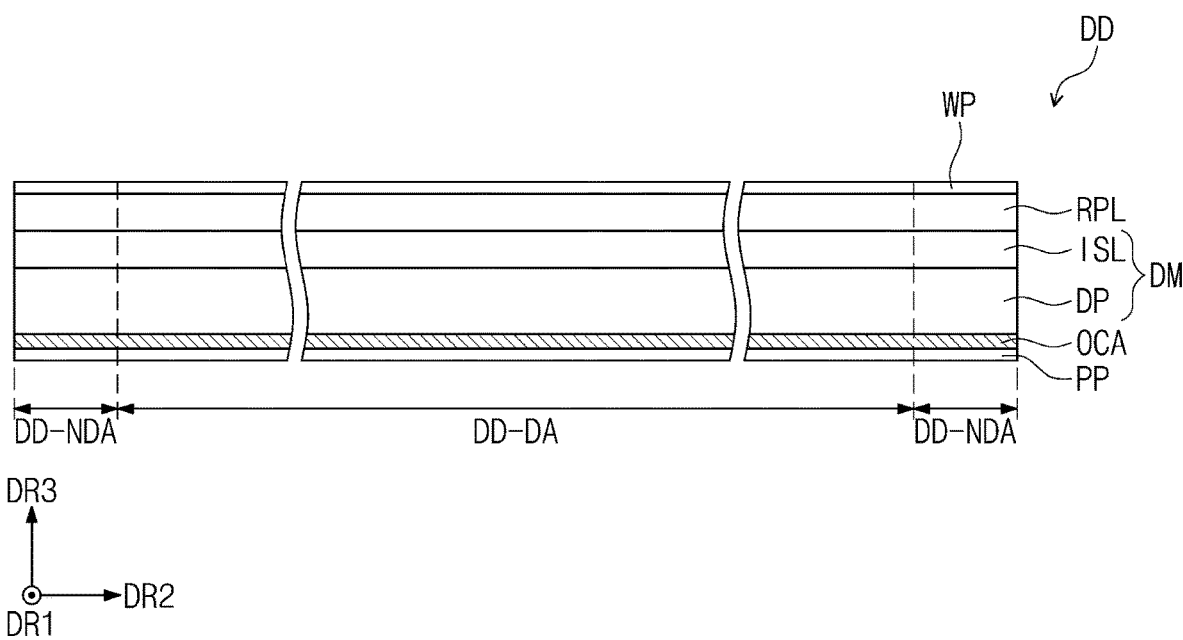

As illustrated in FIG. 2D, the input detection layer ISL, the anti-reflection layer RPL, and the window WP may be sequentially provided on the display panel DP. An optically clear adhesive member OCA may be disposed between the protection panel PP and the display panel DP.

Figure 3A:
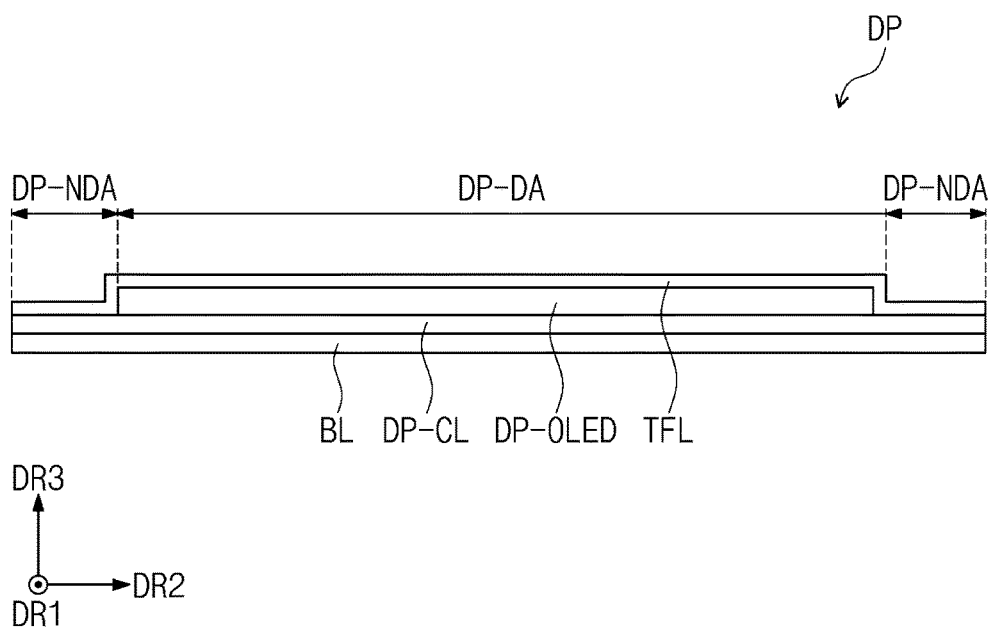
FIGS. 3A and 3B are cross-sectional views illustrating embodiments of a display panel.
Figure 3B:
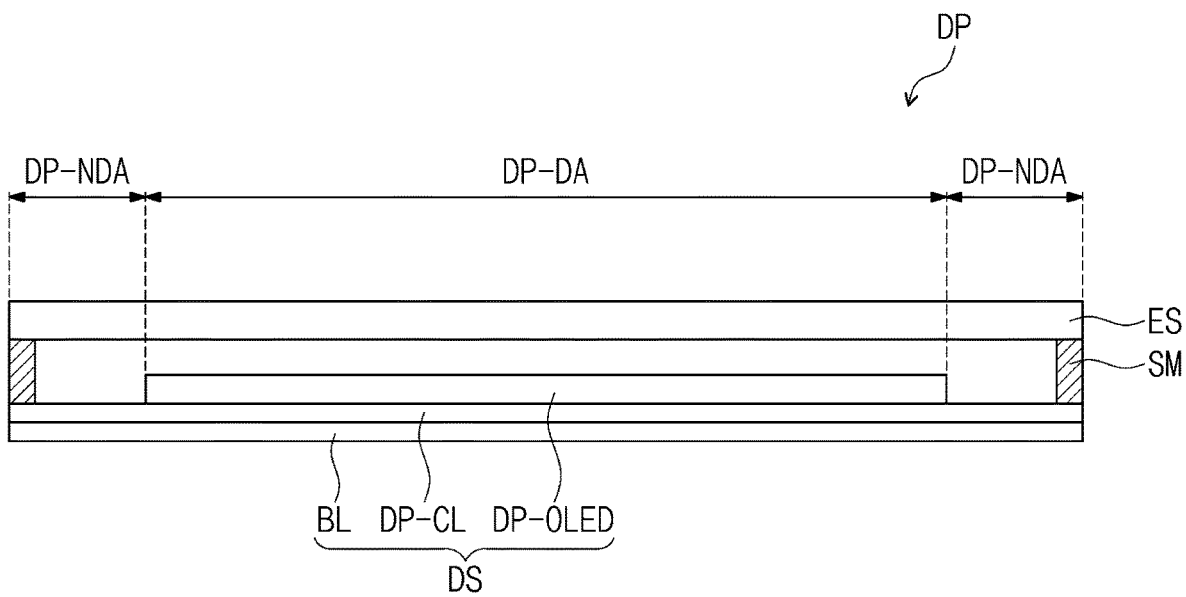

FIGS. 3A and 3B are cross-sectional views illustrating embodiments of a display panel.

As illustrated in FIG. 3A, the display panel DP may include a base layer BL, a circuit element layer DP-CL disposed on the base layer BL, a display element layer DP-OLED, and an upper insulation layer TFL. A display area DP-DA and a non-display area DP-NDA, which correspond to the image area DD-DA and the bezel area DD-NDA in FIG. 1A, respectively, may be defined in the display panel DP. In the embodiment, a feature in which an area corresponds to an area represents the two areas overlap each other (e.g., correspond to each other), but does not represent the two areas have the same surface areas (e.g., planar dimensions or planar areas) as each other.

The base layer BL may include a synthetic resin film. The base layer BL may include a plastic substrate, a glass substrate, a metal substrate or an organic/inorganic substrate.

The circuit element layer DP-CL includes an intermediate insulation layer and a circuit element. The intermediate insulation layer includes an intermediate inorganic film and an intermediate organic film. The circuit element includes signal lines, a driving circuit of the pixel, and the like. Various electronic signals (e.g., image signal, data signal, scan signal, driving signal, power signal, etc.) may be transmitted through the signal lines. A portion of the signal lines may form elements of the driving circuit, without being limited thereto.

The display element layer DP-OLED includes a display element. Although the display element in the display element layer DP-OLED may include various light emitting elements, the invention is not limited thereto. In embodiments, for example, the light emitting elements may include a liquid crystal display ("LCD") element, a light emitting diode ("LED"), a micro-LED, a nano-LED, a quantum dot, or a quantum rod. Hereinafter, the display element will be described as an organic light emitting element. The display element layer DP-OLED may further include an organic film such as a pixel defining film with which the pixels of the display panel DP are defined.

The upper insulation layer TFL includes a plurality of thin-films. The thin-films are disposed to improve an optical efficiency, and to protect the organic light emitting elements. The plurality of thin-films may include or together form a thin-film encapsulation layer. The thin-film encapsulation layer may have an inorganic film/organic film/inorganic film stacked structure. The plurality of thin-films may include a refractive index matching layer.

As illustrated in FIG. 3B, the display panel DP may include a base layer BL, a circuit element layer DP-CL disposed on the base layer BL, a display element layer DP-OLED, an encapsulation substrate ES, and a sealant SM which couples the base layer BL and the encapsulation substrate ES to each other. The encapsulation substrate ES may be spaced a predetermined gap from the display element layer DP-OLED along a thickness direction of the display panel DP. Each of the base layer BL and the encapsulation substrate ES may include a plastic substrate, a glass substrate, a metal substrate or an organic/inorganic composite substrate. The sealant SM may include an organic adhesive member or frit.

Figure 4:
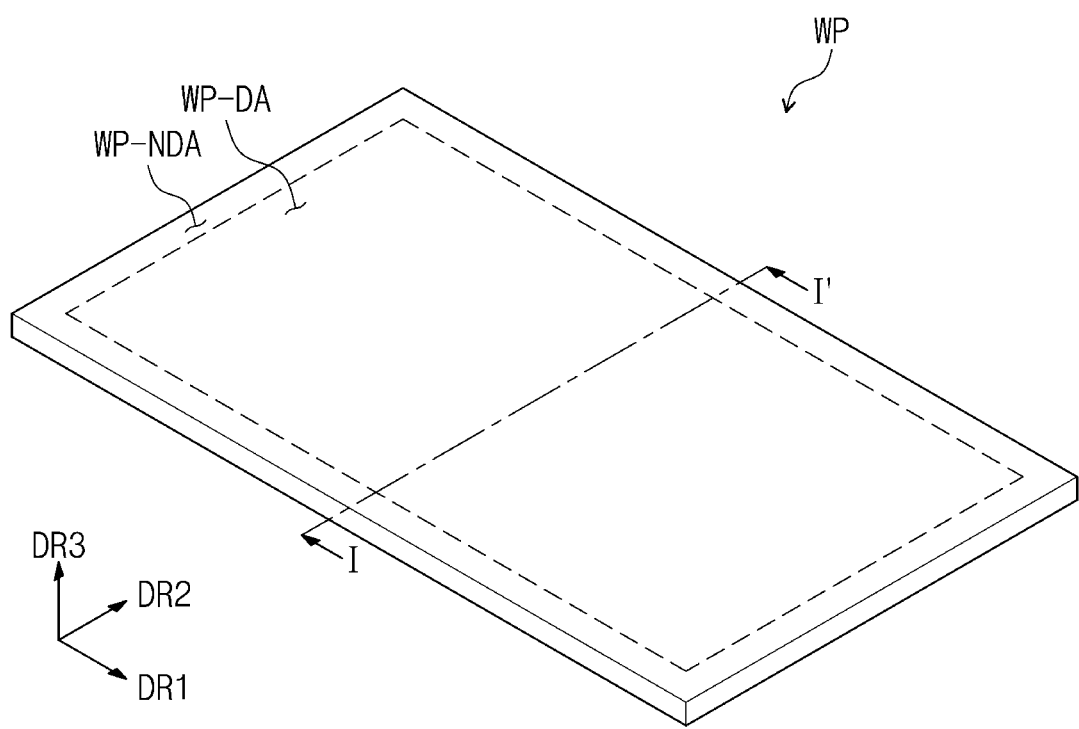
FIG. 4 is a perspective view illustrating an embodiment of a window.

FIG. 4 is a perspective view of an embodiment of a window. FIGS. 5 to 8 are cross-sectional views illustrating embodiment of a window. FIGS. 5 to 8 are cross-sectional views taken along line I-I' of FIG. 4.

In FIGS. 4 to 8, a window WP of a panel-type is illustrated. As illustrated in FIG. 4, in a plan view, the window WP includes a transmission area WP-DA and a light shielding area WP-NDA, which correspond to the image area DD-DA and the bezel area DD-NDA in FIG. 1A, respectively. The light shielding area WP-NDA may be defined as an area at which a light shielding pattern BZ, which will be described later, is disposed.

The transmission area WP-DA may be an area through which light is transmitted, e.g., through which an image is transmittable to be viewable from outside the window WP. The light shielding area WP-NDA may be an area at which light is blocked, e.g., through which an image is not viewable from outside the window WP. The transmission area WP-DA may be defined at a central portion of the window WP (e.g., spaced apart from an outer edge of the window WP) and occupy a relatively large planar area of the window WP from among a total planar area thereof. The light shielding area WP-NDA is disposed at one or more side of the transmission area WP-DA. The light shielding area WP-NDA may be defined at an edge area of the window WP in a plan view. The light shielding area WP-NDA may be defined lengthwise extended along a side surface of the window WP at an outer edge thereof. The transmission area WP-DA overlaps the display area DP-DA (refer to FIG. 3A) of the display panel DP. The light shielding area WP-NDA overlaps the non-display area DP-NDA (refer to FIG. 3A) of the display panel DP.

Figure 5:
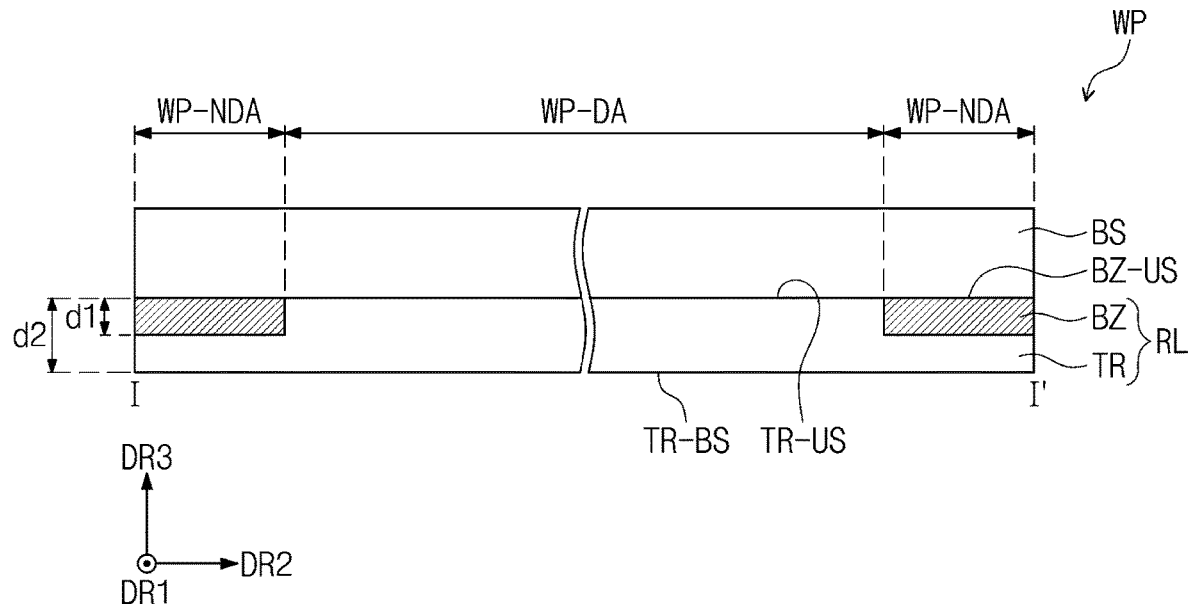
FIGS. 5 to 8 are cross-sectional views illustrating embodiments of a window.

Referring to FIG. 5, the window WP includes a base substrate BS and a resin layer RL. The window WP is attachable to another component of the display device DD such as the display panel DP, at the resin layer RL.

The base substrate BS is disposed at an uppermost portion of the window WP to define a top surface of the window WP. That is, a top surface of the base substrate BS may correspond to the top surface of the window WP.

The base substrate BS may include glass. The base substrate BS may be a glass substrate. The base substrate BS may be a chemically reinforced glass substrate. When the base substrate BS is the chemically reinforced glass substrate, since the base substrate BS may have a relatively small thickness and a relatively large mechanical strength, the base substrate BS may be used as a window WP of a display device DD which is foldable. Here, the base substrate BS may have a thickness of about 20 micrometers (μm) to about 100 μm.

Although not separately shown, the window WP may further include a functional coating layer disposed on a top surface of the base substrate BS. The functional coating layer may include one among an anti-fingerprint layer, an anti-reflection layer, and a hard coating layer.

The resin layer RL is disposed on a rear surface of the base substrate BS. The resin layer RL is disposed on the rear surface of the base substrate BS and disposed adjacent to the display panel DP (refer to FIG. 2A). The resin layer RL is disposed between the base substrate BS and the display panel DP.

The resin layer RL defines or includes the light shielding pattern BZ. That is, the light shielding pattern BZ is accommodated within a total thickness of the resin layer RL. The light shielding pattern BZ overlaps the light shielding area WP-NDA of the window WP. The light shielding pattern BZ may entirely overlap the light shielding area WP-NDA and may not overlap the transmission area WP-DA (e.g., the light shielding pattern BZ may end at the transmission area WP-DA). That is, the light shielding pattern BZ may terminate at a boundary between the light shielding area WP-NDA and the transmission area WP-DA, without being limited thereto. An area in which the light shielding pattern BZ is disposed may be defined as the light shielding area WP-NDA of the window WP.

The resin layer RL may define or include a transmission pattern TR. The transmission pattern TR may be defined as a remaining portion of the resin layer RL except for the light shielding pattern BZ. At least a portion of the transmission pattern TR may overlap the transmission area WP-DA in a plan view. In an embodiment, the transmission pattern TR may entirely overlap the window WP. That is, as illustrated in FIG. 5, the transmission pattern TR may provide or define a total thickness d2 of the resin layer RL. The transmission pattern TR is disposed below the light shielding pattern BZ in the light shielding area WP-NDA, so that the resin layer RL has a total thickness d2. The total thickness d2 may represent a maximum thickness of the resin layer RL.

The transmission pattern TR may have a light transmittance of about 90% or more. The transmission pattern TR may have a light transmittance of about 90% or more and include a material that is capable of being carbonized by light or heat. In an embodiment, the transmission pattern TR may include at least one selected from poly carbonate ("PC"), polymethylmethacrylate ("PMMA"), polyimide ("PI"), polyethylene terephthalate ("PET"), tri-acetatecellulose ("TAC"), and a combination thereof.

The transmission pattern TR may have a top surface TR-US adjacent to the base substrate BS and a bottom surface TR-BS opposite thereto. The bottom surface TR-BS of the transmission pattern TR may be adjacent to the display panel DP (refer to FIG. 2A) (e.g., closer to the display panel DP than the upper surface TR-US). The upper surface TR-US defined by the transmission pattern TR may extend from the transmission area WP-DA, along a side surface of the light shielding pattern BZ and along a bottom surface of the light shielding pattern BZ to an outer edge of the window WP. The transmission pattern TR may be recessed at an outer edge of the window WP, and the light shielding pattern BZ may be provided in the recess provided by the transmission pattern TR.

The light shielding pattern BZ may be defined on a top surface of the resin layer RL. A top surface BZ-US of the light shielding pattern BZ and the top surface TR-US of the transmission pattern TR may provide an integrated plane, e.g., coplanar with each other. That is, a light emitting surface of the resin layer RL is formed by the top surface TR-US which is coplanar with the top surface BZ-US. That is, the top surface BZ-US of the light shielding pattern BZ together with the top surface TR-US of the transmission pattern TR may provide a top surface of the resin layer RI, which is continuous. The top surface of the resin layer RL may provide one plane, even though the transmission pattern TR is recessed at the outer edge of the window WP. That is, the light shielding pattern BZ may be disposed recessed along a thickness direction from the top surface of the resin layer RL since the top surface of the resin layer RL is provided in a single plane (e.g., defined along the first direction DR1 and the second direction DR2 in FIG. 5).

The light shielding pattern BZ may include a carbide. As a material in the transmission pattern TR is carbonized by light or heat, the light shielding pattern BZ may include a carbide having a predetermined color. In an embodiment, the transmission pattern TR may include a first polymer, and the light shielding pattern BZ may include a material that is obtained by carbonizing the first polymer. In an embodiment, for example, the light shielding pattern BZ may include a second polymer that is a carbide of the first polymer. As the first polymer is carbonized, the light shielding pattern BZ may have a black color or a non-black color.

The light shielding pattern BZ may have a thickness that is equal to or less than a total thickness d2 of the resin layer RL. As illustrated in FIG. 5, the light shielding pattern BZ may have a thickness d1 less than the total thickness d2 of the resin layer RL, be extended from the top surface of the resin layer RL, and have a bottom surface that is not exposed along the thickness direction. The resin layer RL may have the total thickness d2 in a range from about 30 μm to about 200 μm.

One or more embodiment of the window WP of the display device DD includes the resin layer RL having a single-layer shape and disposed below the base substrate BS that is a glass substrate, and the light shielding pattern BZ is provided at an upper portion of the resin layer RL through carbonization reaction of a material for forming the resin layer RL. Through this, a stepped portion generated when a conventional light shielding pattern is provided or formed at a lower portion of a conventional window through a process such as deposition, coating, or the like of a light shielding pattern material on a layer of the conventional window, may be removed. Additionally, bubbles or the like generated in the lower portion of the conventional window may be reduced or effectively prevented, to improve reliability of the display device DD including the window WP according to one or more embodiment of the invention.

Figure 6:
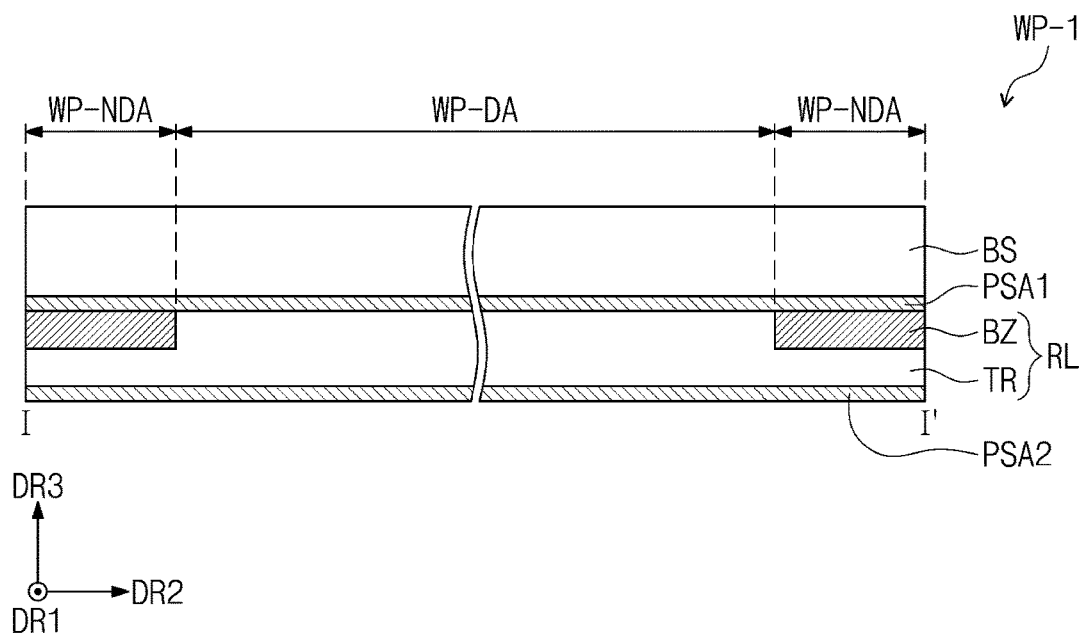

Referring to FIG. 6, a window WP-1 may further include a first adhesive layer PSA1 and a second adhesive layer PSA2.

The first adhesive layer PSA1 may be disposed between a base substrate BS and a resin layer RL and couple the base substrate BS and the resin layer RL to each other. The second adhesive layer PSA2 may be disposed below the resin layer RL. The second adhesive layer PSA2 may be disposed between a component disposed below the window WP-1, e.g., the display panel DP (refer to FIG. 2A), and the resin layer RL. The second adhesive layer PSA2 may couple the resin layer RL and a component disposed therebelow to each other. In an embodiment, each of the first adhesive layer PSA1 and the second adhesive layer PSA2 may be a pressure sensitive adhesive ("PSA") layer.

In one or more embodiment of the window WP-1 of the display device DD, the first adhesive layer PSA1 and the second adhesive layer PSA2 are respectively disposed on upper and lower portions of the resin layer RL disposed below the base substrate BS that is a glass substrate. That is, the resin layer RL is disposed between the first adhesive layer PSA1 and the second adhesive layer PSA2 to provide a stacked or laminated structure. Through this, when the display device DD is folded along a folding axis FX, the resin layer RL disposed between the first adhesive layer PSA1 and the second adhesive layer PSA2 serves as a stress-relieving layer which relieves a stress generated by folding the display device DD, to provide the window WP-1 for a display device DD which is resistant against a folding stress.

Figure 7:
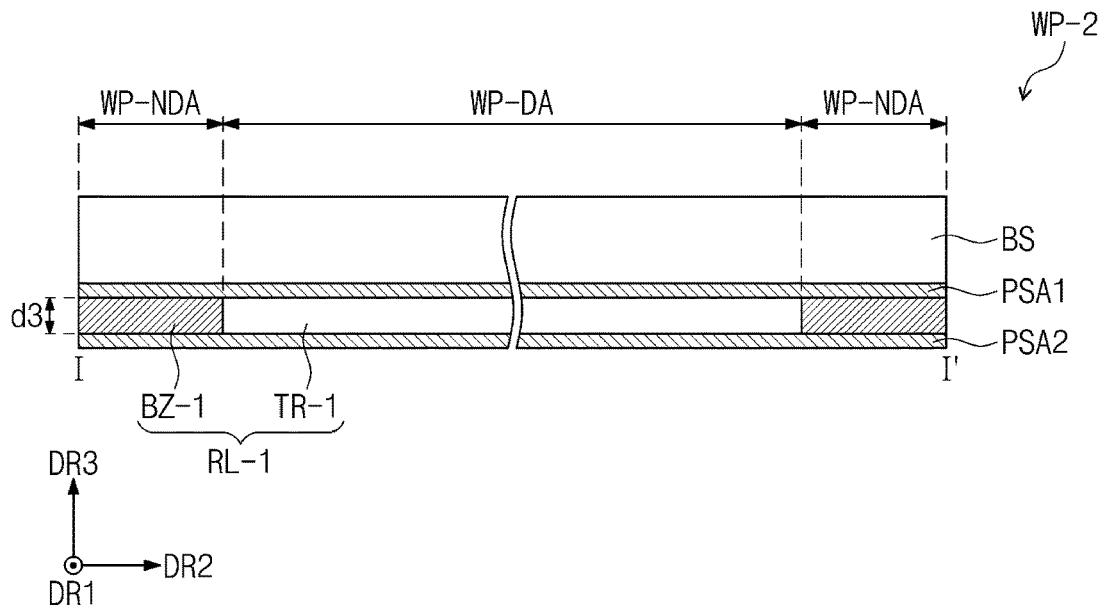

Referring to FIG. 7, a window WP-2 may include a resin layer RL-1 including a light shielding pattern BZ-1 and a transmission pattern TR-1.

The light shielding pattern BZ-1 may have a thickness d3 that is equal to a total thickness d2 (FIG. 5) of the resin layer RL-1. In an embodiment, the light shielding pattern BZ-1 may entirely overlap a light shielding area WP-NDA and may not overlap a transmission area WP-DA in a top plan view (e.g., the light shielding pattern BZ-1 may end at the transmission area WP-DA). That is, the light shielding pattern BZ-1 may terminate at a boundary between the light shielding area WP-NDA and the transmission area WP-DA, without being limited thereto. The transmission pattern TR-1 may entirely overlap the transmission area WP-DA and may not overlap the light shielding area WP-NDA in a top plan view (e.g., the transmission pattern TR-1 may end at light shielding area WP-NDA). That is, transmission pattern TR-1 may terminate at a boundary between the light shielding area WP-NDA and the transmission area WP-DA, without being limited thereto. Although a first adhesive layer PSA1 and a second adhesive layer PSA2 are disposed at upper and lower portions of the resin layer RL-1, respectively, in FIG. 7, the invention is not limited thereto. In an embodiment, for example, the first adhesive layer PSA1 and the second adhesive layer PSA2 may be omitted.

Figure 8:
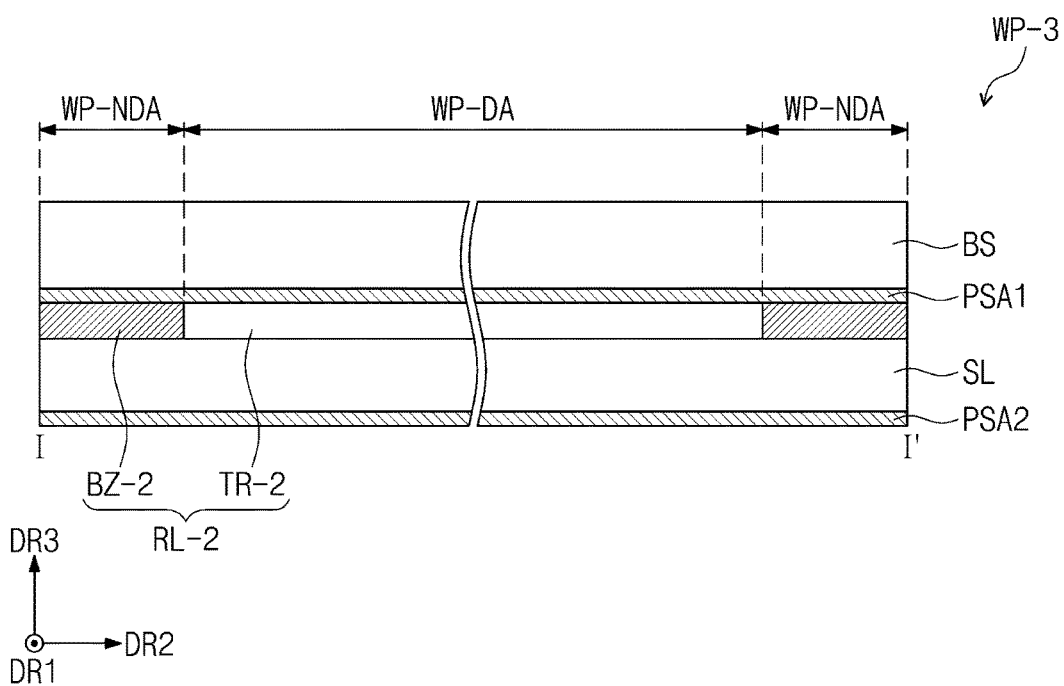

Referring to FIG. 8, a window WP-3 may further include a support layer SL.

The support layer SL is disposed below a resin layer RL-2. The support layer SL serves to support the resin layer RL-2 from below the resin layer RL-2. The support layer SL may be a film including at least one of polycarbonate ("PC"), polymethylmethacrylate ("PMMA"), polyimide ("PI"), polyethylene terephthalate ("PET"), and tri-acetate-cellulose ("TAC").

Similar to the window WP-2 in FIG. 7, a light shielding pattern BZ-2 may have a thickness that is equal to a total thickness of the resin layer RL-2. In an embodiment, the light shielding pattern BZ-2 may entirely overlap a light shielding area WP-NDA and may not overlap a transmission area WP-DA in a top plan view. A transmission pattern TR-2 may entirely overlap the transmission area WP-DA and may not overlap the light shielding area WP-NDA in a top plan view. Although a first adhesive layer PSA1 and a second adhesive layer PSA2 are disposed at upper portion of the resin layer RL-2 and a lower portion of the support layer SL, respectively, in FIG. 8, the invention is not limited thereto. In an embodiment, for example, the first adhesive layer PSA1 and the second adhesive layer PSA2 may be omitted.

Hereinafter, a method for manufacturing a display device DD and a method for manufacturing a window WP for the display device DD will be described.

Figure 9A:
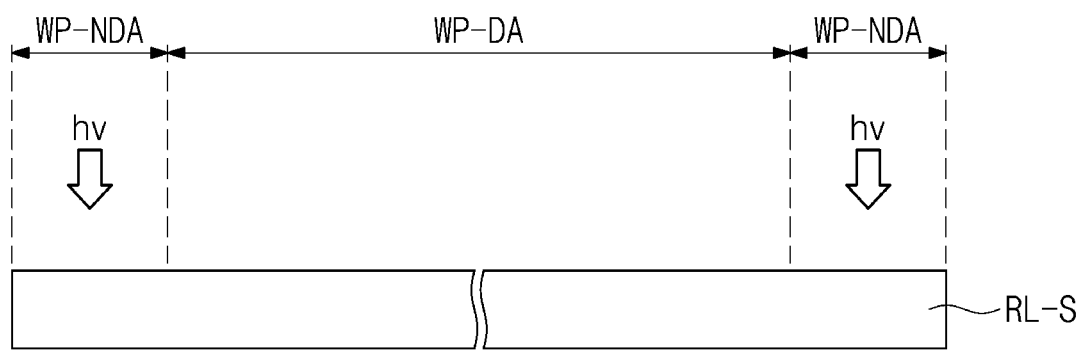
FIGS. 9A to 9C are cross-sectional views illustrating processes in an embodiment of a method for manufacturing a display device.
Figure 9B:
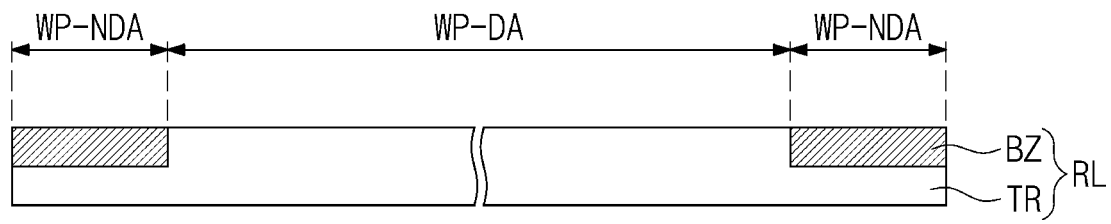
Figure 9C:
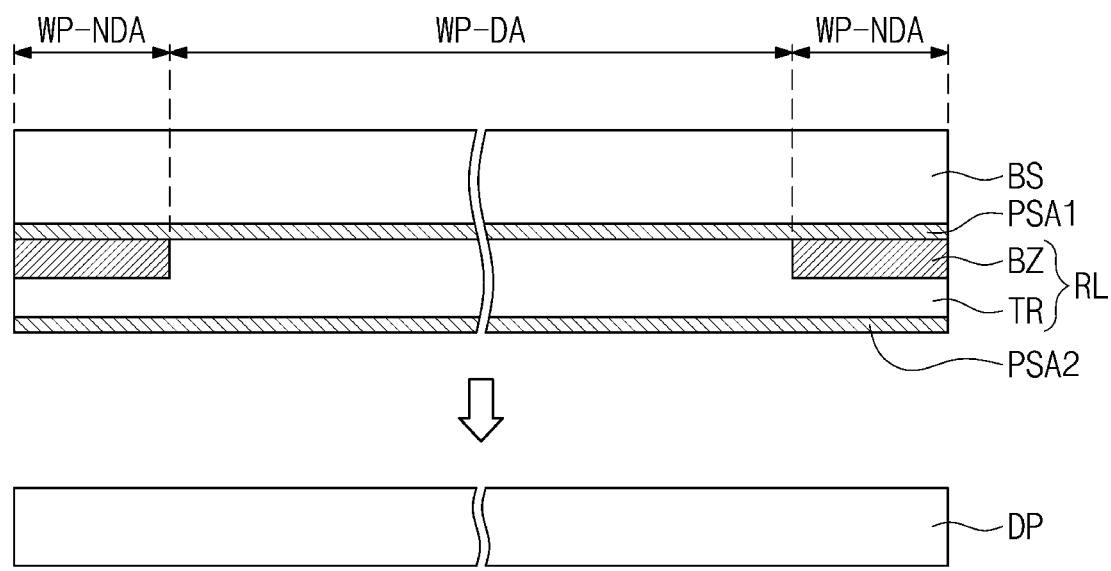

FIGS. 9A to 9C are cross-sectional views illustrating processes in an embodiment of a method for manufacturing the display device DD. In FIGS. 9A and 9B, in the method for manufacturing the display device DD, a process of providing or forming a resin layer RL of a window WP is mainly illustrated. In FIG. 9C, in the method for manufacturing the display device DD, a process of coupling a window WP and a display panel DP is mainly illustrated. While the following description labels the window WP, the method for manufacturing the display device DD may include one or more embodiment of the windows WP, WP-1, WP-2, and WP-3 illustrated in FIGS. 5-8.

The method for manufacturing the display device includes a process of preparing a window WP, a process of preparing a display panel DP, and a process of coupling the window WP and the display panel DP to each other. The process of preparing the window WP includes a process of preparing a base substrate BS and a process of providing or forming a resin layer RL on one surface of the base substrate BS.

Referring to FIGS. 9A and 9B, the method for manufacturing the display device DD includes a process of applying light hv or heat to an outer portion (e.g., outer edge portion) of a preliminary resin layer RL-S to provide the window WP for the display device DD. Hereinafter, a feature of applying the light hv to the preliminary resin layer RL-S will be described as an example.

The preliminary resin layer RL-S has a light transmittance of about 90% or more and includes a material that is capable of being carbonized by light or heat. The preliminary resin layer RL-S is disposed in both the transmission area WP-DA and the light shielding area WP-NDA. In an embodiment, the preliminary resin layer RL-S may include at least one selected from polycarbonate ("PC"), polymethylmethacrylate ("PMMA"), polyimide ("PI"), polyethylene terephthalate ("PET"), tri-acetatecellulose ("TAC"), and a combination thereof.

In the process of applying the light hv to the preliminary resin layer RL-S, the light hv may be applied to an area corresponding to a light shielding area WP-NDA of the window WP which will be provided or formed from the preliminary resin layer RL-S. As the light hv is applied to the outer portion of the preliminary resin layer RL-S, which corresponds to the light shielding area WP-NDA of the window WP, a property of a material in the preliminary resin layer RL-S may be changed to provide or form a light shielding pattern BZ. Here, a remaining portion of the material in the preliminary resin layer RL-S is not changed in property by the light hv to provide or form a transmission pattern TR. That is, the light shielding pattern BZ and the transmission pattern TR are portions of a same material layer (e.g., the preliminary resin layer RL-S).

The light shielding pattern BZ may be provided or formed by carbonizing a material in the preliminary resin layer RL-S. The preliminary resin layer RL-S may include a first polymer, and the light shielding pattern BZ may be provided or formed of a material obtained by carbonizing the first polymer by the light hv. The light shielding pattern BZ may be provided or formed such that the material in the preliminary resin layer RL-S is changed in property to have a black color or a non-black color by a carbonization reaction.

Referring to FIG. 9B in conjunction with FIG. 9C, the resin layer RL is provided or formed by applying the light hv to the preliminary resin layer RL-S, and then a base substrate BS and the resin layer RL may be coupled to each other with the first adhesive layer PSA1 therebetween. The first adhesive layer PSA1 may be provided or formed on a top surface of the resin layer RL and then coupled with the base substrate BS. Alternatively, the first adhesive layer PSA1 may be provided or formed on a bottom surface of the base substrate BS and then coupled with the resin layer RL.

Referring to FIG. 9C, the method for manufacturing the display device DD may include a process of manufacturing the window WP by coupling the base substrate BS and the resin layer RL, and then coupling the window WP with another component such as a display panel DP.

In an embodiment, as illustrated in FIG. 9C, a second adhesive layer PSA2 may be provided or formed below the resin layer RL, and the window WP and the display panel DP may be coupled to each other by the second adhesive layer PSA2. Also, the second adhesive layer PSA2 may be provided or formed on the display panel DP, and the window WP may be coupled with the display panel DP having the second adhesive layer PSA2 thereon. Although only the second adhesive layer PSA2 is exemplarily disposed between the display panel DP and the window WP in FIG. 9C, the invention is not limited thereto. In an embodiment, for example, various functional layers may be disposed between the display panel DP and the window WP, to provide a display device DD.

Figure 10A:
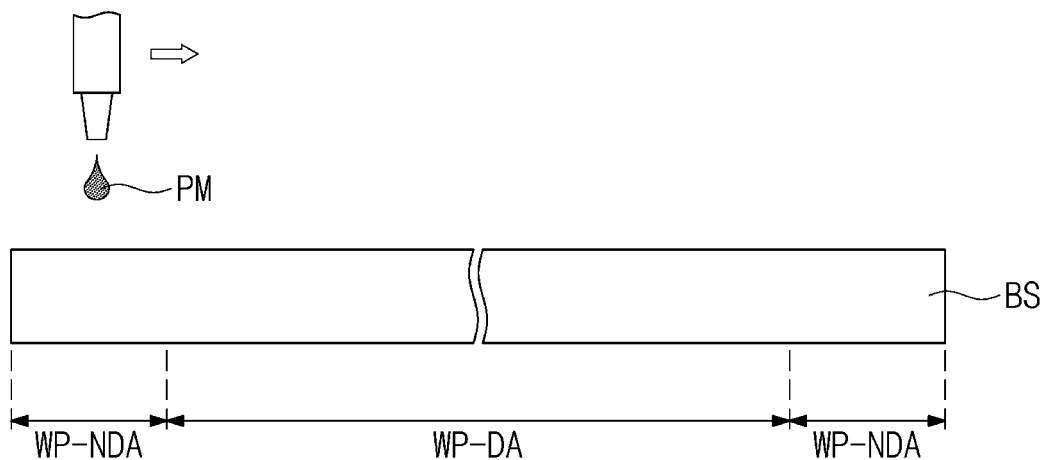
FIGS. 10A to 10C are cross-sectional views illustrating processes of an embodiment of a method for manufacturing a window.
Figure 10B:
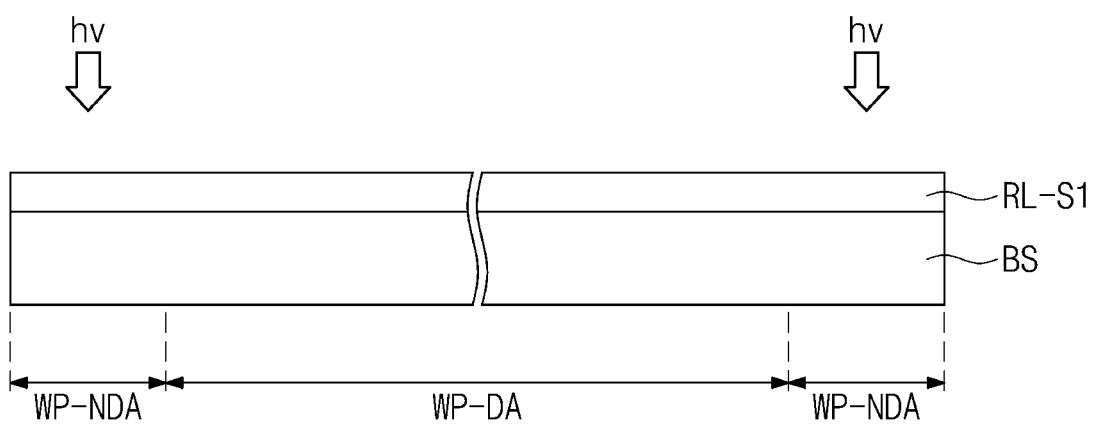
Figure 10C:
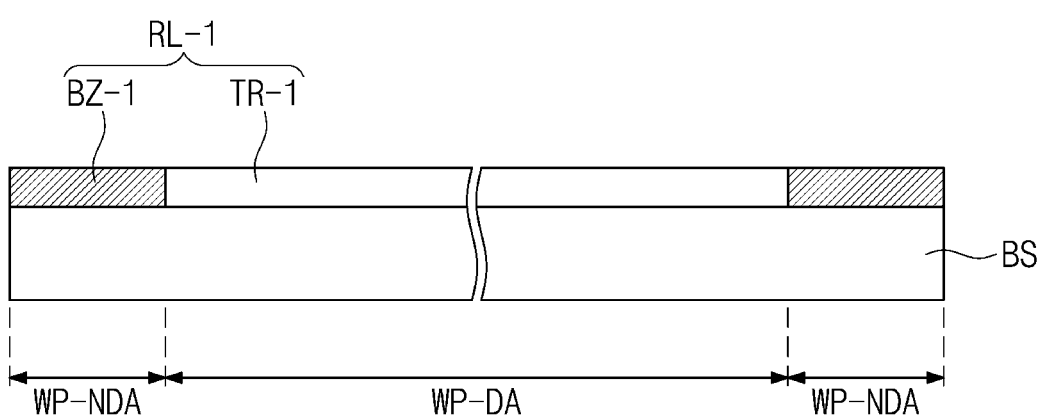

FIGS. 10A to 10C are cross-sectional views illustrating processes of an embodiment of a method for manufacturing the window WP. Hereinafter, in describing FIGS. 10A to 10C, the components described previously in FIGS. 9A to 9C will be designated by the same reference numerals, and description for the components will be omitted. While the following description labels the window WP, the method for manufacturing the display device DD may include one or more embodiment of the windows WP, WP-1, WP-2, and WP-3 illustrated in FIGS. 5-8.

Referring to FIGS. 10A and 10B, a preliminary resin layer RL-S1 may be provided or formed by applying a polymer PM on a base substrate BS. The polymer PM may be a material which is carbonizable by light hv or heat. The polymer PM may have a light transmittance of about 90% or more.

Referring to FIGS. 10A to 10C, a process of providing or forming the preliminary resin layer RL-S1 by applying the polymer PM on the base substrate BS and then applying light hv to an outer portion of the preliminary resin layer RL-S1 may be provided. The outer portion of the preliminary resin layer RL-S1 may correspond to a portion of a window WP, which overlaps a light shielding area WP-NDA. As the light hv is applied to the outer portion of the preliminary resin layer RL-S1, a light shielding pattern BZ-1 may be provided or formed to overlap the light shielding area WP-NDA of the window WP. The light shielding pattern BZ-1 of the resin layer RL-1 may be provided or formed in the preliminary resin layer RL-S1 at the outer edges thereof, and then a remaining portion of the preliminary resin layer RL-S1 in which the light shielding pattern BZ-1 is not provided or formed, may be defined as a transmission pattern TR-1 of the resin layer RL-1.

According to one or more embodiment, in the window WP having the pattern for shielding light provided or formed by removing the conventional stepped portion generated by the light shielding pattern as described above, bubbles or the like generated when the window WP and another component such as a display module DM is coupled may be reduced or effectively prevented, and, through this, the reliability of the display device DD may improve.

Although the embodiments of the invention have been described, it is understood that the invention should not be limited to these embodiments but various changes and modifications can be made by one ordinary skilled in the art within the spirit and scope of the invention as hereinafter claimed.

Thus, the real protective scope of the invention shall be determined by the technical scope of the accompanying claims.

What is claimed is:

1. A display device comprising:
a display panel from which light is transmitted; and
a window through which the light from the display panel is transmitted to outside the display device, the window comprising:
a transmission area through which the light is transmitted,
a light shielding area which is adjacent to the transmission area and blocks the light,
a resin layer at which the window is attachable to the display panel, and
a carbonized portion of the resin layer defining a light shielding pattern which corresponds to the light shielding area and blocks the light,
wherein
the resin layer further defines a transmission pattern which is adjacent to the light shielding pattern and through which the light from the display panel is transmitted,
the transmission pattern corresponds to the transmission area and terminates at a boundary between the light shielding area and the transmission area,
the transmission pattern comprises a first polymer, and
the light shielding pattern comprises a carbonized polymer in which the first polymer is carbonized.

2. The display device of claim 1, wherein the transmission pattern has a light transmittance of about 90% or more.

3. The display device of claim 1, wherein
each of the light shielding pattern and the transmission pattern comprises a top surface and a bottom surface opposite to each other, the bottom surface being closer to the display panel than the top surface, and
the top surface of the light shielding pattern and the top surface of the transmission pattern are coplanar with each other.

4. The display device of claim 1, wherein the window further comprises:
a first adhesive layer,
a base substrate facing the resin layer with the first adhesive layer therebetween; and
a second adhesive layer facing the first adhesive layer with the resin layer therebetween.

5. The display device of claim 1, wherein the light shielding pattern has a thickness equal to or less than a total thickness of the resin layer.

6. The display device of claim 1, wherein the display panel comprises:
a display area at which an image is displayed, the display area corresponding to the transmission area of the window; and
a non-display area adjacent to the display area, the non-display area corresponding to the light shielding area of the window.

7. The display device of claim 1, wherein the window further comprises:
a folding area at which the display device is bendable with respect to a folding axis; and
a flat area which extends from the folding area in a direction away from the folding axis.

8. The display device of claim 1, wherein the window further comprises a glass substrate facing the display panel with the resin layer therebetween.

9. The display device of claim 1, wherein the resin layer has a thickness from about 30 micrometers to about 200 micrometers.

10. The display device of claim 1, wherein the resin layer comprises at least one selected from polycarbonate, polymethylmethacrylate, polyimide, polyethylene terephthalate, tri-acetatecellulose and a combination thereof.

11. The display device of claim 1, wherein the window further comprises a support layer between the resin layer and the display panel.

12. A window for a display device, the window comprising:
a base substrate comprising:
a transmission area through which light from a display panel is transmitted, and a light shielding area adjacent to the transmission area; and a resin layer between the base substrate and the display panel, wherein a carbonized portion of the resin layer defines a light shielding pattern corresponding to the light shielding area of the base substrate, the resin layer further defines a transmission pattern which is adjacent to the light shielding pattern and through which the light is transmitted, the transmission pattern corresponds to the transmission area and terminates at a boundary between the light shielding area and the transmission area, the transmission pattern comprises a first polymer, and the light shielding pattern comprises a carbonized polymer in which the first polymer is carbonized.

13. The window of claim 12, wherein the base substrate comprises a glass substrate.

14. A method for manufacturing a window for a display device, the method comprising:

preparing a base substrate comprising:

a transmission area through which light from a display panel is transmittable, and a light shielding area adjacent to the transmission area; and providing a resin layer of the window on the base substrate at the transmission area and the light shielding area thereof, and in which a light shielding pattern is defined corresponding to the light shielding area, wherein the providing the resin layer comprises:

the resin layer being carbonizable by a carbonization reaction including application of light or heat, and defining the light shielding pattern as a portion of the resin layer which is carbonized by the carbonization reaction including the application of light or heat to the portion of the resin layer.

15. The method of claim 14, wherein the providing the resin layer further comprises providing an adhesive layer between the resin layer in which the light shielding pattern is defined and the base substrate.

16. The method of claim 14, wherein the providing the resin layer comprises:

providing a carbonizable polymer on the base substrate at the transmission area and the light shielding area thereof, and defining the light shielding pattern as a portion of the carbonizable polymer which is carbonized by the carbonization reaction including application of light or heat to the portion of the resin layer.

* * * * *